US011639997B2

(12) United States Patent
Feshali et al.

(10) Patent No.: US 11,639,997 B2
(45) Date of Patent: May 2, 2023

(54) INTEGRATED OPTICAL TRANSMITTER AND RECEIVER

(71) Applicant: Intel Corporation, Santa Clara, CA (US)

(72) Inventors: Avi Feshali, Los Angeles, CA (US); Haisheng Rong, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 356 days.

(21) Appl. No.: 17/072,831

(22) Filed: Oct. 16, 2020

(65) Prior Publication Data
US 2021/0055416 A1 Feb. 25, 2021

Related U.S. Application Data

(62) Division of application No. 15/721,614, filed on Sep. 29, 2017, now Pat. No. 10,908,286.

(51) Int. Cl.
G01S 7/481 (2006.01)
H01L 31/0232 (2014.01)
H01L 31/0224 (2006.01)
G01S 17/10 (2020.01)
G01S 17/42 (2006.01)
G01S 17/89 (2020.01)

(52) U.S. Cl.
CPC ............ G01S 17/10 (2013.01); G01S 7/4811 (2013.01); G01S 7/4814 (2013.01); G01S 7/4817 (2013.01); G01S 17/42 (2013.01); G01S 17/89 (2013.01); H01L 31/02327 (2013.01); H01L 31/022416 (2013.01)

(58) Field of Classification Search
None
See application file for complete search history.

(56) References Cited

U.S. PATENT DOCUMENTS

| | | |
|---|---|---|
| 8,981,383 B1 | 3/2015 | Fish et al. |
| 9,224,882 B2 | 12/2015 | Na et al. |
| 9,599,781 B1 | 3/2017 | Skogen et al. |
| 9,740,079 B1 | 8/2017 | Davids et al. |
| 10,126,412 B2 | 11/2018 | Eldada et al. |
| 10,587,090 B1 | 3/2020 | Raring et al. |
| 2004/0105644 A1 | 6/2004 | Dawes |
| 2006/0120667 A1 | 6/2006 | Reed et al. |
| 2012/0286136 A1* | 11/2012 | Krill ............... G01S 7/4817 250/206 |
| 2014/0376001 A1* | 12/2014 | Swanson ........... G01N 21/17 356/479 |
| 2015/0131080 A1 | 5/2015 | Retterath et al. |
| 2015/0378187 A1 | 12/2015 | Heck et al. |
| 2016/0093600 A1* | 3/2016 | Bower ............... H01L 24/82 257/89 |
| 2016/0139266 A1 | 5/2016 | Montoya et al. |
| 2016/0161600 A1* | 6/2016 | Eldada ............. G01S 7/4814 356/5.01 |
| 2016/0161691 A1 | 6/2016 | Hayakawa |
| 2017/0023733 A1 | 1/2017 | Florjanczyk et al. |
| 2017/0184450 A1* | 6/2017 | Doylend ........... G01B 11/22 |

(Continued)

Primary Examiner — Eric L Bolda
(74) Attorney, Agent, or Firm — Banner & Witcoff Ltd.

(57) ABSTRACT

Technology for light detection and ranging (LIDAR) sensor can include an optical signal source, an optical modulation array and optical detector on the same integrated circuit (IC) chip, multi-chip module (MCM) or similar solid-state package.

20 Claims, 5 Drawing Sheets

(56) References Cited

U.S. PATENT DOCUMENTS

| | | |
|---|---|---|
| 2017/0299697 A1 | 10/2017 | Swanson |
| 2018/0102442 A1 | 4/2018 | Wang et al. |
| 2018/0156661 A1* | 6/2018 | Doylend ............... G01S 7/4813 |
| 2018/0232048 A1 | 8/2018 | Popovich et al. |
| 2019/0006753 A1* | 1/2019 | Swanson ............ G02B 27/0087 |
| 2019/0101647 A1 | 4/2019 | Feshali et al. |

* cited by examiner

INTEGRATED OPTICAL TRANSMITTER AND RECEIVER

CROSS-REFERENCE TO RELATED APPLICATIONS

The present application is divisional of U.S. patent application Ser. No. 15/721,614, filed on Sep. 29, 2017, the contents of which are incorporated herein by reference in their entirety.

BACKGROUND

Techniques or accurately measuring distances is important in a number of applications, such as in autonomous driving vehicles, drones, and robotics. A light detection and ranging (LIDAR) system can be used to measure the distance to objects by illuminating an area with a laser light, and calculating the distance to objects by measuring the time-of-light of the laser light reflected from the objects. Conventional LIDAR systems include a laser, one or more rotating mirrors and a photodetector or an array of photodetectors. The conventional LIDAR systems are therefore bulky, and require accurate alignment of moving parts, which adds significant costs to the systems. Therefore, there is a continuing need or improved LIDAR systems.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

DESCRIPTION OF EMBODIMENTS

Figure 1:
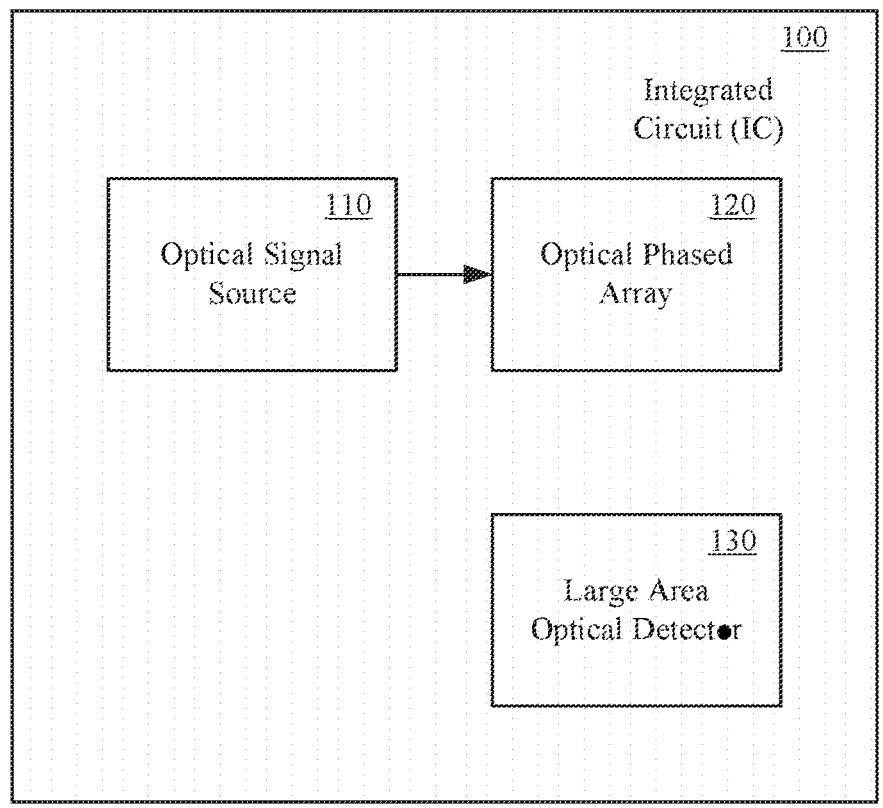
FIG. 1 is a diagram illustrating a light detection and ranging (LIDAR) integrated circuit (IC) in accordance with an example.

Before invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used or describing particular examples or embodiments only and is not intended to be limiting. The same reference numerals in different drawings represent the same element.

Numbers provided in low charts and processes are provided or clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support or plural referents unless the context clearly dictates otherwise. Thus, for example, reference to "a layer" includes a plurality of such layers.

Reference throughout this specification to "an example" means that a particular feature, structure, or characteristic described in connection with the example is included in at least one invention embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list or convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives or the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of are closed terms, and include only the components, structures, steps, or the like specifically listed in conjunction with such terms, as well as that which is in accordance with U.S. Patent law." Consisting essentially of or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or unction of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily or describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of actors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support or the exact numerical value recited apart from the "about" terminology is also provided.

Numerical amounts and data may be expressed or presented herein in a range format. It is to be understood, that such a range format is used merely or convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus or practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), lash drive, optical drive, magnetic hard drive, solid state drive, or other medium or storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as central processing units (CPUs), graphics processing units (GPUs), digital signal processors (DSPs), microcontrollers (MCUs), embedded controller (ECs), field programmable gate arrays (FPGAs), or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (LSI) circuits or gate arrays, of-the-shelf semiconductors such as logic chips, transistors, or other discrete components. A module may also be implemented in programmable hardware devices such as field programmable gate arrays, programmable array logic, programmable logic devices, or the like.

Modules may also be implemented in software or execution by various types of processors. An identified module of executable code may, or instance, comprise one or more physical or logical blocks of computer instructions, which may, or instance, be organized as an object, procedure, or unction. Nevertheless, the executables of an identified module may not be physically located together, but may comprise disparate instructions stored in different locations which, when joined logically together, comprise the module and achieve the stated purpose or the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

A light detection and ranging (LIDAR) system can include an optical source, an optical phased array (OPA) and optical detector on the same integrated circuit (IC) chip, multi-chip module (MCM) or similar solid-state package and fabricated in the same process low. The LIDAR can include a laser to generate optical signals, an OPA to steer transmission of the optical signals, and a large area detector to receive reflected optical signals from a large angular field of view (FOV). The time of light between the transmitted optical signals and the received reflected optical signals can be used to determine the distance to objects.

FIG. 1 is a diagram illustrating a light detection and ranging (LIDAR) integrated circuit (IC) in accordance with one example. In one aspect, the IC I 00 can include an optical signal source 110, an optical phased array (OPA) 120, and a large area optical detector 130. In one instance the optical signal source 110, the OPA 120, and the large area detector 130 can be integrated in a semiconductor die (e.g. a single die). In another instance, the optical source 110, the OPA 120, and the large area optical detector 130 can be integrated in a plurality of semiconductor die of a multi-chip module (MCM).

In one aspect, the optical signal source 110 can be a laser or generating a laser beam. The frequency of the laser beam can optionally be adjustable. In one aspect, the optical signal source 110 can generate a laser beam parallel to the surface of the IC, MCM or the like.

In one aspect, the OPA 120 can be optically coupled to receive optical signals from the optical signal source 110. The optical signal generated by the optical source 110 can be a rapid series of pulses of optical signals. The optical signal from the optical source 110 can be split among multiple waveguide paths in the OPA 120. Optical modulators in the OPA 120 can modulate the phase in the multiple waveguide paths. By modulating the optical signals in the multiple waveguide paths, the OPA 120 can steer the optical signals in two dimensions (2D) of an area illuminated by the optical signals output from the OPA 120. In one aspect, the OPA 120 can also turn the direction of propagation of the laser beam from parallel to perpendicular to the surface of the IC, MCM or the like. Therefore, the optical signals can be transmitted from a major surface (e.g., front) of the IC, MCM or the like.

In one aspect, the large area optical detector 130 can be disposed on the major surface (e.g., front) of the IC, MCM or the like, and receive light incident thereon. In one aspect, the large area optical detector 130 can receive a large angular field of view of reflected optical signals. In one instance, the large area optical detector 130 can be a coherent optical photodetector.

In one aspect, the large area optical detector 130 can include a normal incidence photodetector portion and a waveguide photodetector portion. The waveguide photo detector portion can include an optical waveguide and a photodetector. The optical waveguide can be configured to couple light to the photodetector of the waveguide photodetector portion.

In one aspect, the optical waveguide can be integrated in a first semiconductor layer. In one instance, the first semiconductor layer can be a N-doped epitaxial silicon semiconductor layer. For example, the epitaxial silicon layer may be disposed on an insulator layer, wherein the insulator layer is disposed on a substrate to form a semiconductor-on-insulator (SOI) structure. The photodetector of the waveguide photodetector portion can be integrated in a second and a third semiconductor layer. In one instance, the second semiconductor layer can be a III-V semiconductor, such as indium phosphide (InP). The third semiconductor layer can be a III-V semiconductor, such as a separate-confinement-heterostructure (SCH), quantum-well (QW) semiconductor.

In one aspect, the normal incidence photodetector portion can be disposed on the waveguide photodetector portion. The photodetector of the normal incidence photodetector portion can be integrated in the third semiconductor layer and a fourth semiconductor layer. Accordingly, the third semiconductor layer can be utilized to form corresponding parts of the photodetector of both the waveguide photodetector portion and the normal incidence photodetector portion. In one instance, the fourth semiconductor layer can be a P-doped type III-V semiconductor, such as indium phosphide (InP).

In one aspect, a control unit can be coupled to the LIDAR IC 100. The control unit can control tuning of the optical source 110 or example. The control unit can also control the OPA 120 to steer the light output in two dimension (2D) or example. For instance, the control unit may provide one or more signals to control phase shifts in each of a plurality of waveguides of the OPA 120. The control unit can also control light detection by the large area optical detector 130 or example. The control unit can also perform time-of-light (TOF) calculations based upon the light output from the OPA 120 and the reflected light received by the large area optical detector 130. Alternatively, one or more, or all, of the functions of the control unit may be integrated into the LIDAR IC 100.

In one aspect, the position of the OPA 120 relative to the large area optical detector 130, when fabricated in an IC, MCM or the like, is fixed. Therefore, the need or alignment and calibration is reduced. Furthermore, the position of the OPA 120 relative to the large area optical detector 130 does not change as a result of mechanical vibrations and stress over the life span of the LIDAR system.

Figure 2:
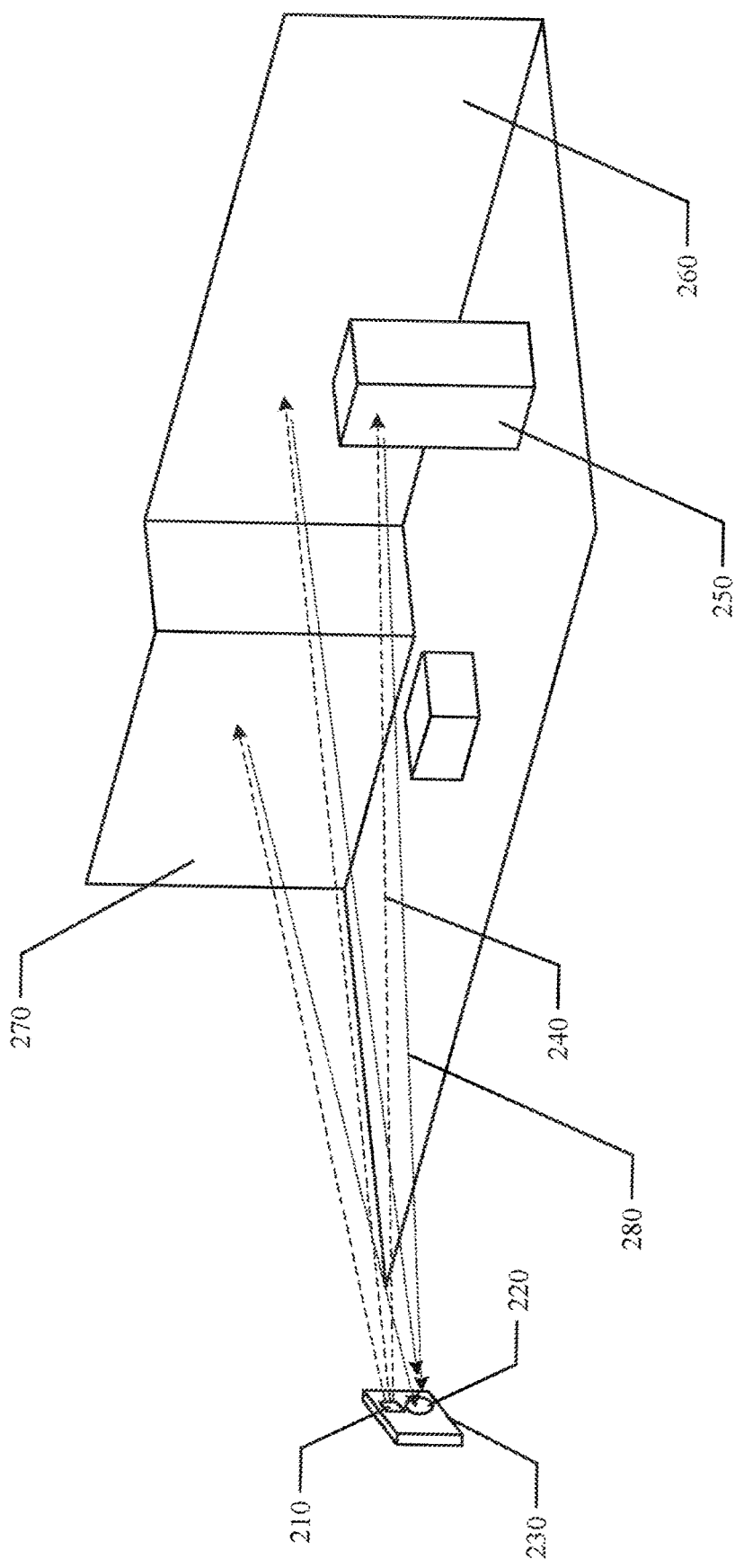
FIG. 2 is a diagram illustrating operation of a LIDAR system in accordance with an example.

FIG. 2 is a diagram illustrating operation of a light detection and ranging (LIDAR) system in accordance with examples of the present technology. In one aspect, the LIDAR system can include an optical phased array (OPA) 210 and an optical detector 220 fabricated on an integrated circuit (IC) 230, multi-chip module (MCM) or the like. The OPA 210 steers a series of optical signals 240 in two dimensions (2D). The optical signals can be pulses of infrared light. The optical signals 240 reflect off objects within a target area. For example, optical signals scanned horizontally across a target area may reflect of a pillar 250, a far wall 260 and a near wall 270. In one aspect, the reflected optical signals 280 are detected by the optical detector 220. A time-of-light (TOF) from when the optical signals 210 were transmitted from the LIDAR 200 to when the corresponding reflected optical signals 250 were detected can be determined by the LIDAR system. The TOF measurements can be made based on direct reflected light, backscattered light or a combination thereof. In the case of mobile LIDAR applications, the height, location and orientation of the LIDAR system can be combined with the scan position and TOF to determine the location of objects 250, 260, 270 in three dimensions (3D). The LIDAR system can measure distance to a wide range of materials, including metallic and non-metallic objects, liquids, and gases. In addition, a narrow laser-beam can map targets with very high resolution.

Accordingly, FIG. 2 is illustrative of an embodiment of a light detection and ranging method. Specifically, the LIDAR system outputs the optical signals 240 using the OPA and the optical detector 220 then detects a reflected portion of the optical signal. In some embodiments, the outputting of the optical signals 240 can be perpendicular to a major surface of the integrated circuit 230, and the reflected portion detected incident on the major surface of the integrated circuit 230. The TOF can then be determined based on the output optical signal and the reflected portion of the optical signal. In some embodiments, detecting the reflected portion of the optical signal can include coupling part of the reflection portion of the optical signal by one or more waveguides. The LIDAR method can be used to determine a location of one or more objects based on the determined TOF and the location and orientation of the integrated circuit.

Figure 3:
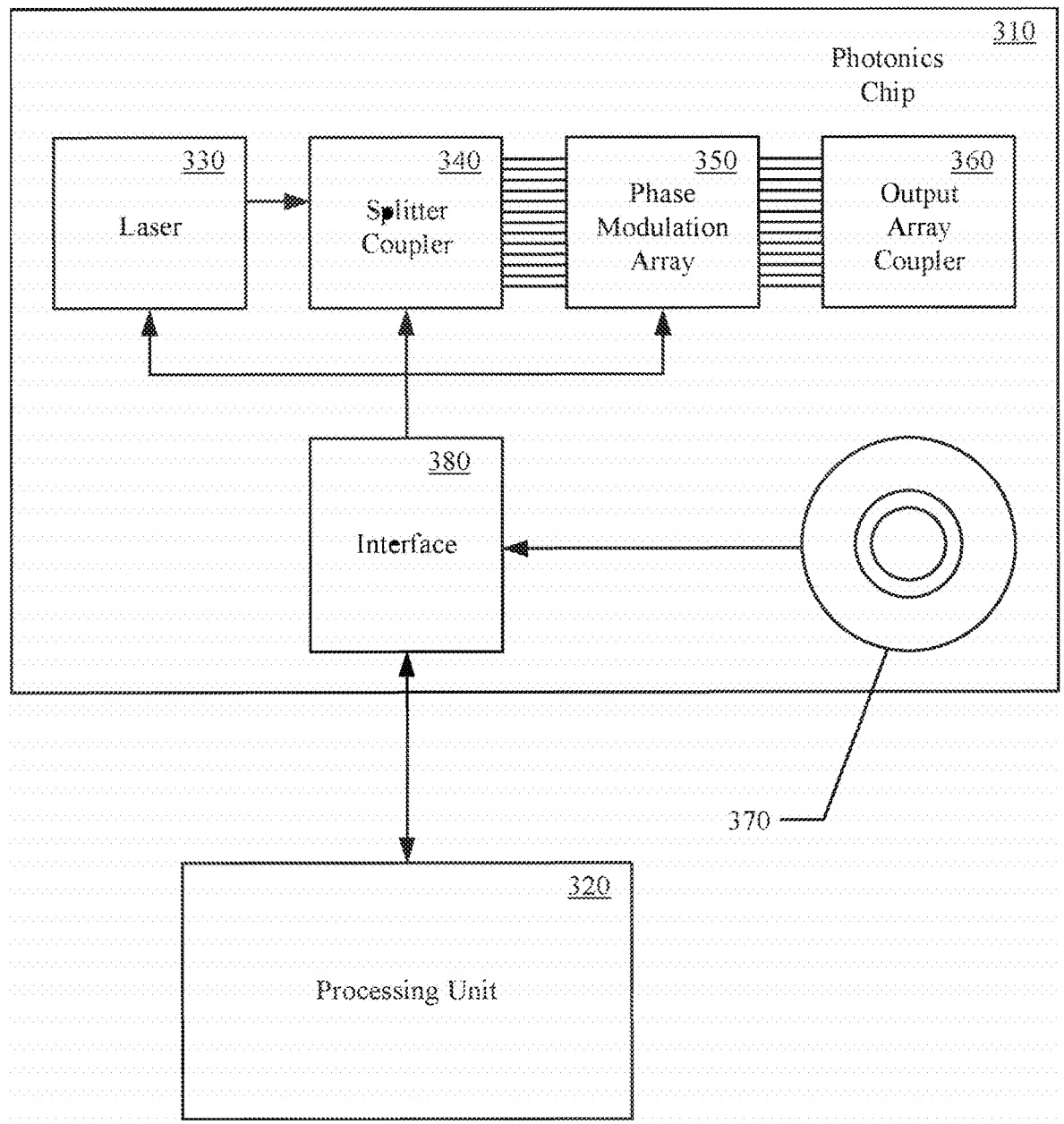
FIG. 3 is a diagram illustrating a LIDAR IC in accordance with an example.

FIG. 3 is a diagram illustrating a light detection and ranging (LIDAR) system in accordance with another example. The LIDAR system can include a photonics integrated circuitry (IC) 310 and one or more processing units 320. The photonics chip 310 can include a laser 330, an optical splitter coupler 340, a phase modulation array 350, an output array coupler 360, a large area optical detector 370, and an interface 380. The laser 330, the optical splitter coupler 340, the phase modulation array 350, the output array coupler 360, the large area optical detector 370, and the interface 380 can be integrated together in an IC chip, a multi-chip module (MCM) or similar solid-state package.

In one aspect, the laser 330 can be a wavelength tunable hybrid silicon (Si)/III-V semiconductor laser that generates infrared light. In one aspect, the optical splitter coupler 340 can optically couple optical signals from the laser 330 to a plurality (N) of waveguides of the optical phased array 350. The optical splitter coupler 340 can be a one-to-many (1×N) coupler. The optical splitter coupler 340 can be a star coupler. In one instance, the phase modulation array 350 may include 64, 128, 256 or more waveguides and the optical coupler 340 may be a 1×64, 1×128, 1×256 or corresponding optical coupler. The phase modulation array 350 can include a plurality of waveguides with optical phase modulators. The phase of the light traveling in the waveguides of the phase modulation array 350 can be varied to steer the optical signals in two dimensions (2D) at the output of the output array coupler 360. The output array coupler 360 can couple optical signals into free space. The output array coupler 360 can include a plurality of gratings to increase the coupling of optical signals into free space.

In one aspect, the large area optical detector 370 can receive a large angular field of view (FOV) of reflected optical signals. In one instance, the large area optical detector 370 can be a coherent optical photodetector. In one aspect, the large area optical detector 370 can include a normal incidence photodetector portion and a waveguide photodetector portion. The waveguide photo detector portion can include an optical waveguide and a photodetector. The optical waveguide can be configured to couple light to the photodetector of the waveguide photodetector portion.

In one aspect, the one or more processing units 320 can control tuning of the wavelength of the laser 330 or example. The one or more processing units 320 can also control the phase modulation array 350 to steer the light output in two dimensions (2D) for example. For instance, the one or more processing units 320 may provide one or more signals to control phase shifts in each of a plurality of waveguides of the phase modulation array 350. The one or more processing units 320 can also control light detection by the large area optical detector 370 for example. The one or more processing units 320 can also perform time-of-light calculations based upon the light output from the output array coupler 360 and the reflected light received by the large area optical detector 370. For instance, the one or more processing units 320 may calculate distances (D) to objects from the time delay between transmitted light pulses and the detected return light pulses according to Equation 1, $$D=(c \cdot t)/2 \quad (1)$$

where c is the speed of light, and t is the time delay.

Figure 4A:
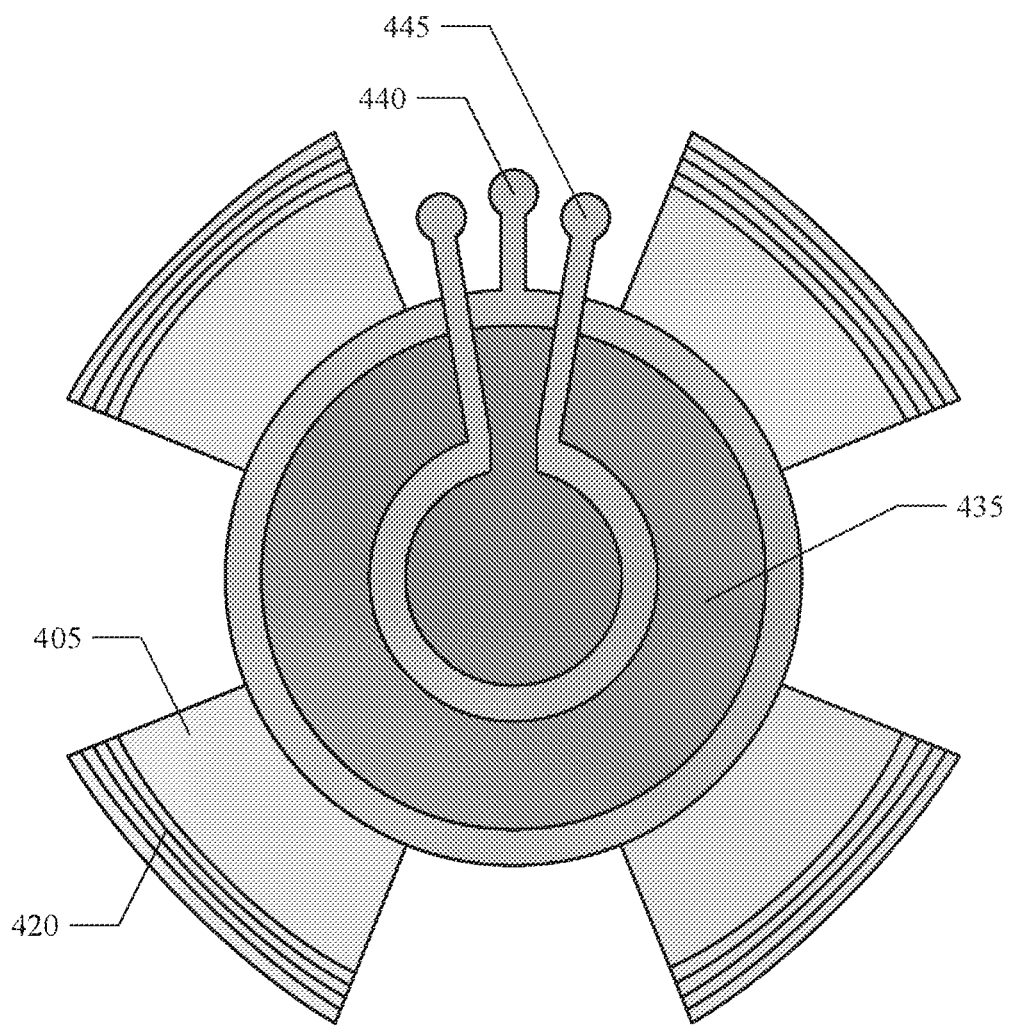
FIGS. 4A and 4B are diagrams illustrating a large area optical detector of a LIDAR IC in accordance an example.
Figure 4B:
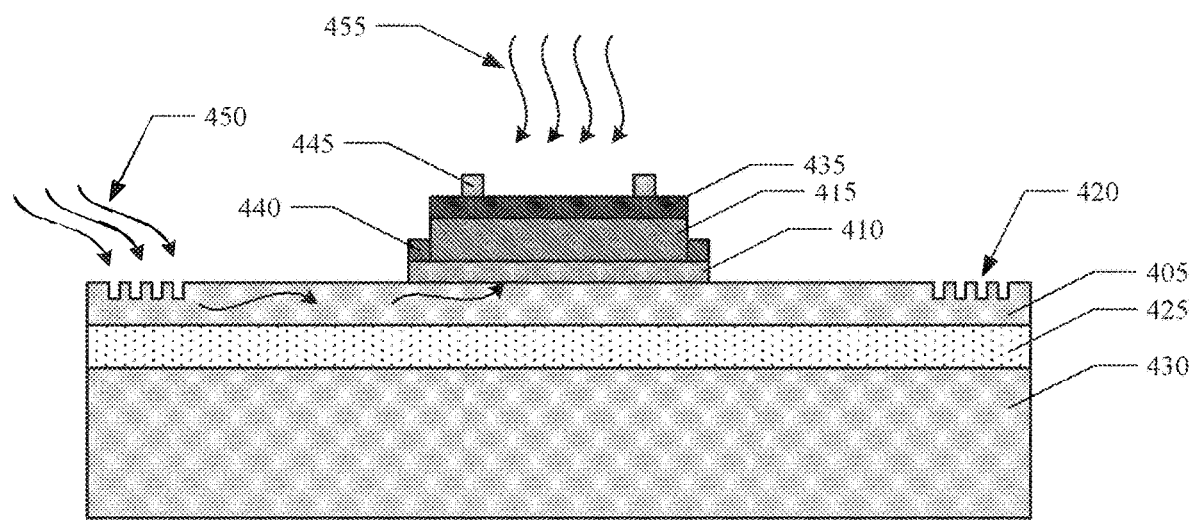

FIGS. 4A and 4B are diagrams illustrating a large area optical detector of a light detection and ranging (LIDR) integrated circuit (IC) in accordance an example. FIG. 4A shows a top view illustration of the large area optical detector, while FIG. 4B shows a side view illustration of the large area optical detector. In one aspect, the large area optical detector can include a normal incidence photodetector portion and a waveguide photodetector portion. The large area detector including the normal incidence photodetector portion and the waveguide photodetector portion can have a large light sensitive area of approximately 100 μm2 to 100 mm2.

In one aspect, the waveguide photodetector portion can include one or more optical waveguides 405 and a photodetector 410, 415. The optical waveguides 405 can be configured to couple light to the photodetector 410, 415 of the waveguide photodetector portion. The optical waveguides 405 can include a plurality of gratings 420 to increase couple of light from free space into the waveguide photodetector portion. It is to be appreciated that curved lines of the gratings 420 are merely or illustrative purposes. The gratings 420 may have any appropriate or desired structure or coupling light from free space into the waveguide photodetector portion.

In one aspect, the one or more optical waveguides 405 can be integrated in a first semiconductor layer. In one instance, the first semiconductor layer can be disposed on an insulator layer 425, wherein the insulator layer 425 is disposed on a substrate 430 to form a semiconductor-on-insulator (SOI) structure. The photodetector 410, 415 of the waveguide photodetector portion can be integrated in a second and a third semiconductor layer. In one instance, the second semiconductor layer can be an N-doped III-V semiconductor, such as indium phosphide (InP). The third semiconductor layer can be a III-V semiconductor, such as a separate-confinement-heterostructure (SCH), quantum-well (QW) semiconductor.

In one aspect, the normal incidence photodetector portion can include a photodetector 415, 435 disposed on the photodetector 410, 415 of the waveguide photodetector portion. The photodetector of the normal incidence photodetector portion can be integrated in the third semiconductor layer and a fourth semiconductor layer. Accordingly, the third semiconductor layer can be utilized to form a corresponding part of the photodetector of both the waveguide photodetector portion and the normal incidence photodetector portion. In one instance, the fourth semiconductor layer can be a P-doped type III-V semiconductor, such as indium phosphide (InP). The large area optical detector can also include a plurality of conductors 440, 445 or coupling the normal incidence photodetector portion and the waveguide photodetector portion to one or more other circuits of the LIDR IC, such as an analog to digital converter (ADC), interface and/or a control unit.

In one aspect, light 450 can be coupled through the waveguide 405 to the photodetector 410, 415 of the waveguide photodetector portion. In the layer of the photodetector 410, 415 of the waveguide photodetector portion, the light generates electron-hole pairs. A potential voltage across the conductors 440, 445 sweep the electrons and holes to respective conductors to generate a current in response to the light incident on the waveguide 405 of the waveguide photodetector portion. Similarly, light 455 incident on the normal incidence photodetector portion generates electron-hole pairs. The generated electrons and holes are swept to respective conductors to generate a current in response to the light incident on the normal incidence photodetector portion. The current can then be converted to a signal representative of the reflected optical signals received by the large area optical detector.

Embodiments of the present technology advantageously provide a low-cost solid state LIDAR sensor, as compared to the more expensive and bulkier mechanical LIDAR sensor according to the conventional art. The optical transmitter and receiver of the LIDAR sensor according to embodiments of the present technology can advantageously be implemented in an IC chip, multi-chip module (MCM) or similar solid-state package.

EXAMPLES

The following examples pertain to specific technology embodiments and point out specific features, elements, or steps that may be used or otherwise combined in achieving such embodiments.

In one example there is provided a light detection and ranging (LIDR) device comprising: a laser integrated in a chip; a splitter coupler integrated in the chip, the coupler including an input coupled to the laser and a plurality of outputs; a phase modulation array integrated in the chip, the phase modulation array including a plurality of inputs each coupled to a respective one of the plurality of outputs of the splitter coupler; an output array coupler integrated in the chip, the output array coupler coupled to the plurality of outputs of the phase modulation array; a photodetector integrated in the chip, the photodetector including a normal incidence photodetector portion; and a waveguide photodetector portion coupled to the normal incidence photodetector portion.

In one example of a LIDR device, the chip comprises a silicon on insulator (SOI) substrate.

In one example of a LIDR device, an optical waveguide of the waveguide photodetector portion is integrated in a silicon layer of the SOI substrate.

In one example of a LIDR device, the photodetector comprises: the waveguide photodetector portion including, an optical waveguide integrated in a first semiconductor layer; a first photodetector disposed on the optical waveguide, wherein the first photodetector is integrated in a second semiconductor layer and third semiconductor layer, and wherein the optical waveguide is configured to couple light to the first photodetector; the normal incidence photodetector portion including, a second photodetector disposed on the first photodetector, wherein the second photodetector is integrated in the third semiconductor layer and a fourth semiconductor layer.

In one example of a LDR device, the waveguide photodetector portion further includes an input grating coupler integrated in the first semiconductor layer and configured to couple light incident on the input grating coupler to the optical waveguide.

In one example of a LIDR device, one or more of the second semiconductor layer, the third semiconductor layer, and the fourth semiconductor layer include a group III-V semiconductor.

In one example of a LIDR device, one or more of the second semiconductor layer, the third semiconductor layer, and the fourth semiconductor layer include an indium phosphide (InP) semiconductor.

In one example of a LDR device, the laser includes a frequency tunable hybrid laser.

In one example of a LIDR device, the splitter coupler includes a 1×N star coupler.

In one example of a LIDR device, the photodetector comprises a coherent optical photodetector.

In one example there is provided, an integrated circuit comprising: an optical signal source;
an optical phased array to steer optical signals from the optical signal source in two dimensions (2D); and a large area optical detector to receive, from a large angular field of view, reflected optical signals, wherein the large area optical detector is disposed in a fixed position relative to the optical phased array on the integrated circuit.

In one example of an integrated circuit, the large area detector is integrated in a group III-V semiconductor.

In one example of an integrated circuit, the large area detector is integrated in an indium phosphide (InP) semiconductor.

In one example of an integrated circuit, the large area optical detector comprises a coherent optical photodetector.

In one example of an integrated circuit, the large area optical detector comprises: a normal incidence photodetector portion; and a waveguide photodetector portion coupled to the normal incidence photodetector portion.

In one example of an integrated circuit, the waveguide photodetector portion comprises: an optical waveguide integrated in a first semiconductor layer; and a first photodetector disposed on the optical waveguide, wherein the first photodetector is integrated in a second semiconductor layer and a third semiconductor layer, and wherein the optical waveguide is configured to couple light to the first photodetector.

In one example of an integrated circuit, the normal incidence photodetector portion comprises: a second photodetector disposed on the first photodetector, wherein the second photodetector is integrated in the third semiconductor layer and a fourth semiconductor layer.

In one example of an integrated circuit, the waveguide photodetector portion further includes a grating coupler integrated in the first semiconductor layer and configured to couple light incident on the grating coupler to the optical waveguide.

In one example there is provided, a light detection and ranging (LIDAR) system comprising: a photonics chip including; a laser; a splitter coupler including an input coupled to the laser and a plurality of outputs; a phase modulation array, including a plurality of inputs each coupled to a respective one of the plurality of outputs of the splitter coupler, the phase modulation array configured to steer optical signals in two dimensions (2D) at an output of an output array coupler; the output array coupler coupled to the plurality of outputs of the phase modulation array; a large area photodetector configured to receive reflected optical signals from a large angular field of view; and an interface coupled to the laser, the splitter coupled, the phase modulation array and the wide area photodetector; and one or more processing units communicatively coupled to the interface of the photonics chip.

In one example of a light detection and ranging (LIDAR) system, the one or more processing units are configured to control the steering by the phase modulation array of the optical signal in two dimensions (2D) at output of the output array coupler.

In one example of a light detection and ranging (LIDAR) system, the one or more processing units are configured to determine time of light information of optical signal transmitted by the output array coupler and the reflected optical signal received by the large area photodetector.

In one example of a light detection and ranging (LIDAR) system, the large area optical detector includes: a normal incidence photodetector portion; and a waveguide photodetector portion coupled to the normal incidence photodetector portion.

In one example of light detection and ranging (LIDAR) system, the waveguide photodetector portion comprises: an optical waveguide integrated in a first semiconductor layer; and a first photodetector disposed on the optical waveguide, wherein the first photodetector is integrated in a second semiconductor layer and a third semiconductor layer, and wherein the optical waveguide is configured to couple light to the first photodetector.

In one example of light detection and ranging (LIDAR) system, the waveguide photodetector portion further includes a grating coupler integrated in the first semiconductor layer and configured to couple light incident on the grating coupler to the optical waveguide.

In one example of light detection and ranging (LIDAR) system, the normal incidence photodetector portion comprises: a second photodetector disposed on the first photodetector, wherein the second photodetector is integrated in the third semiconductor layer and a fourth semiconductor layer.

In one example there is provided, a light detection and ranging (LIDAR) method comprising: outputting an optical signal output perpendicular to a major surface of an integrated circuit wherein the optical signal is steered in two dimensions; detecting a reflected portion of the optical signal incident on the major surface of the integrated circuit; and determining a time of light (TOF) based on the output optical signal and the detected reflected portion of the optical signal.

In one example of a LIDAR method, the method further comprises: determining a location of one or more objects based on the determined TOF and the location and orientation of the integrated circuit.

In one example of a LIDAR method, detecting the reflected portion of the optical signal includes coupling part of the reflected portion of the optical signal by an optical waveguide of the integrated circuit or detection by a photodetector of the integrated circuit.

In one example of a LIDAR method, detecting the reflected portion of the optical signal further includes detecting an additional part of the reflected portion of the optical signal incident on the photodetector of the integrated circuit.

In one example of a LIDR method, the method further comprises: splitting the optical signal into an optical phased array of the integrated circuit; and modulating the phase of the optical signal in the optical phased array to steer the optical signal in two dimensions.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

The invention claimed is:

1. An integrated circuit, comprising:
    an optical signal source;
    an optical phased array configured to steer optical signals from the optical signal source in two dimensions; and
    a two dimensional (2D) optical detector configured to receive reflected optical signals associated with a field of view, the 2D optical detector comprising:
        a normal incidence photodetector portion; and
        a waveguide photodetector portion coupled to the normal incidence photodetector portion,
    wherein the 2D optical detector is disposed in a fixed position relative to the optical phased array on the integrated circuit.

2. The integrated circuit of claim 1, wherein the 2D optical detector is integrated in a group III-V semiconductor.

3. The integrated circuit of claim 1, wherein the 2D optical detector is integrated in an indium phosphide (InP) semiconductor.

4. The integrated circuit of claim 1, wherein the 2D optical detector comprises a coherent optical photodetector.

5. The integrated circuit of claim 1, wherein the waveguide photodetector portion comprises:
    an optical waveguide integrated in a first semiconductor layer; and
    a first photodetector disposed on the optical waveguide, wherein the first photodetector is integrated in a second semiconductor layer and a third semiconductor layer, and wherein the optical waveguide is configured to couple light to the first photodetector.

6. The integrated circuit of claim 5, wherein the normal incidence photodetector portion comprises:
a second photodetector disposed on the first photodetector,
wherein the second photodetector is integrated in the third semiconductor layer and a fourth semiconductor layer.

7. The integrated circuit of claim 5, wherein the waveguide photodetector portion further comprises a grating coupler integrated in the first semiconductor layer and configured to couple light incident on the grating coupler to the optical waveguide.

8. A light detection and ranging (LIDAR) system, comprising:
a photonics chip, comprising:
a laser;
a splitter coupler including an input coupled to the laser and to a plurality of outputs;
a phase modulation array including a plurality of inputs, each one of the plurality of inputs being coupled to a respective one of the plurality of outputs of the splitter coupler, the phase modulation array being configured to steer optical signals in two dimensions at an output of an output array coupler that is coupled to a plurality of outputs of the phase modulation array;
a two-dimensional (2D) photodetector configured to receive reflected optical signals associated with an angular field of view, the 2D photodetector comprising (i) normal incidence photodetector portion, and (ii) a waveguide photodetector portion coupled to the normal incidence photodetector portion; and
an interface coupled to the laser, the splitter coupler, the phase modulation array, and the 2D photodetector; and
a processor communicatively coupled to the interface of the photonics chip.

9. The LIDAR system of claim 8, wherein the processor is configured to control the steering of the optical signals by the phase modulation array in two dimensions at the output of the output array coupler.

10. The LIDAR system of claim 8, wherein the processor is configured to determine time of flight information of the optical signals transmitted by the output array coupler and the reflected optical signals received by the 2D photodetector.

11. The LIDAR system of claim 8, wherein the waveguide photodetector portion comprises:
an optical waveguide integrated in a first semiconductor layer; and
a first photodetector disposed on the optical waveguide, wherein the first photodetector is integrated in a second semiconductor layer and a third semiconductor layer, and
wherein the optical waveguide is configured to couple light to the first photodetector.

12. The LIDAR system of claim 11, wherein the waveguide photodetector portion further comprises a grating coupler integrated in the first semiconductor layer and configured to couple light incident on the grating coupler to the optical waveguide.

13. The LIDAR system of claim 11, wherein the normal incidence photodetector portion comprises:
a second photodetector disposed on the first photodetector,
wherein the second photodetector is integrated in the third semiconductor layer and a fourth semiconductor layer.

14. The integrated circuit of claim 1, wherein the 2D optical detector comprises a plurality of semiconductor layers, and
wherein one of the plurality of semiconductor layers is common to the normal incidence photodetector portion and to the waveguide photodetector portion.

15. The LIDAR system of claim 8, wherein the 2D photodetector comprises a plurality of semiconductor layers, and
wherein one of the plurality of semiconductor layers is common to the normal incidence photodetector portion and to the waveguide photodetector portion.

16. A two-dimensional (2D) optical detector, comprising:
a normal incidence photodetector portion; and
a waveguide photodetector portion coupled to the normal incidence photodetector portion,
wherein the 2D optical detector is disposed in a fixed position relative to an optical phased array within an integrated circuit,
wherein the optical phased array steers a transmission, in two dimensions, of optical signals generated via an optical signal source, and
wherein the 2D optical detector is configured to receive optical signals that are reflected from the transmission of the steered optical signals, the received optical signals being associated with a field of view.

17. The 2D optical detector of claim 16, wherein the waveguide photodetector portion comprises:
an optical waveguide integrated in a first semiconductor layer; and
a first photodetector disposed on the optical waveguide, wherein the first photodetector is integrated in a second semiconductor layer and a third semiconductor layer, and
wherein the optical waveguide is configured to couple light to the first photodetector.

18. The 2D optical detector of claim 17, wherein the normal incidence photodetector portion comprises:
a second photodetector disposed on the first photodetector,
wherein the second photodetector is integrated in the third semiconductor layer and a fourth semiconductor layer.

19. The 2D optical detector of claim 17, wherein the waveguide photodetector portion further comprises a grating coupler integrated in the first semiconductor layer and configured to couple light incident on the grating coupler to the optical waveguide.

20. The 2D optical detector of claim 16, comprising:
a plurality of semiconductor layers,
wherein one of the plurality of semiconductor layers is common to the normal incidence photodetector portion and to the waveguide photodetector portion.

* * * * *